United States Patent [19]

Smith et al.

[11] Patent Number: 5,198,659
[45] Date of Patent: Mar. 30, 1993

[54] WIDE-RANGE MULTICOLOR IR DETECTOR

[75] Inventors: Doran D. Smith, Brick; Mitra Dutta, Matawan; Kwong-Kit Choi, Tinton Falls, all of N.J.

[73] Assignee: The United States of America as represented by the Secretary of the Army, Washington, D.C.

[21] Appl. No.: 867,726

[22] Filed: Mar. 23, 1992

[51] Int. Cl.$^5$ .................................. H01J 40/14
[52] U.S. Cl. ........................... 250/214.1; 257/17
[58] Field of Search ............ 250/214.1, 338.4, 370.01, 250/370.12; 257/17, 21, 184; 324/158 D

[56] References Cited

U.S. PATENT DOCUMENTS

| | | | |
|---|---|---|---|
| 4,814,837 | 3/1989 | Kirchoefer | 257/17 |
| 4,816,878 | 3/1989 | Kano et al. | 257/17 |
| 4,894,526 | 1/1990 | Bethea et al. | 250/214.1 |
| 5,013,918 | 5/1991 | Choi | 250/338.4 |
| 5,016,064 | 5/1991 | Goronkin | 257/17 |
| 5,036,371 | 7/1991 | Schwartz | 257/21 |
| 5,047,822 | 9/1991 | Little, Jr. et al. | 257/21 |

OTHER PUBLICATIONS

Peters et al., "New Method of Controlling the Gaps Between the Minibands of a Superlattice", Applied Physics Letters 55(11), Sep. 11, 1989, pp. 1006–1008.
Trzeciakowski et al., "Tailoring the Intersubband Absorption in Quantum Wells", Applied Physics Letters 55(9), Aug. 28, 1989, pp. 891–893.

Primary Examiner—David C. Nelms
Assistant Examiner—S. Allen
Attorney, Agent, or Firm—Michael Zelenka; William H. Anderson

[57] ABSTRACT

An IR photodetector including an IR semiconductor detector with conductive layers on opposite, parallel surfaces. A semiconductor substrate supports the semiconductor IR detector. A circuit is connected across the semiconductor IR detector to provide a bias voltage and for measuring current flow through the semiconductor IR detector. The semiconductor IR detector has a lattice structure made up of a series of potential wells separated by relatively wide potential barriers such that each well has two confined energy levels. A thin spike barrier is placed in the center of alternate potential wells to tailor the absorption characteristics of the semiconductor IR detector. Multicolor operation is achieved by selecting the appropriate well widths for a first group of potential wells and by placing thin spike barriers in a second group of potential wells that are alternately placed between the wells of the first group.

8 Claims, 3 Drawing Sheets

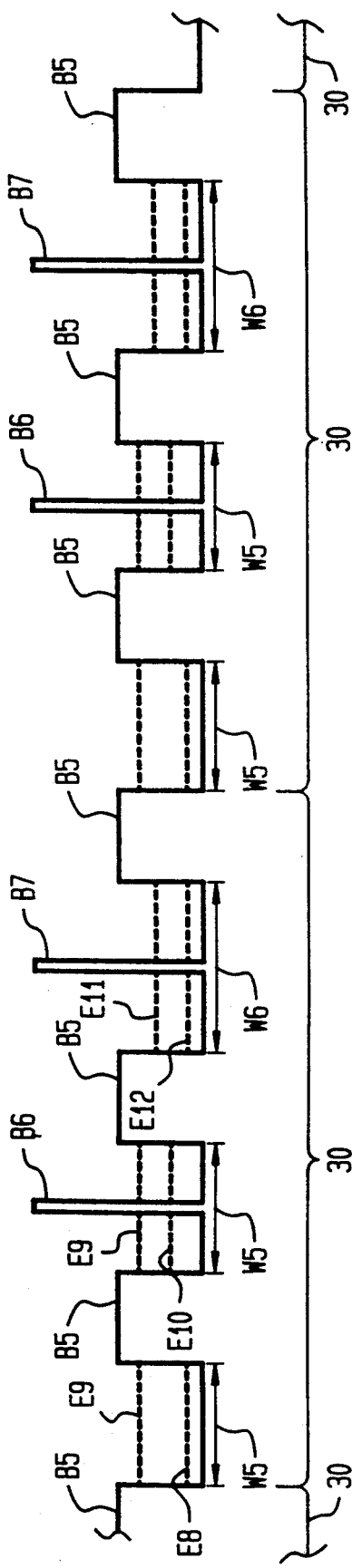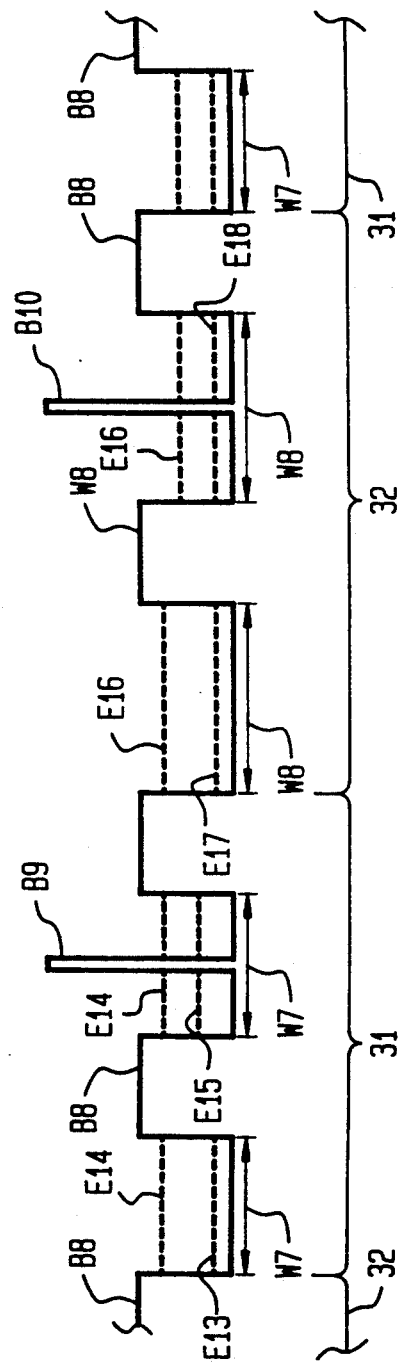

WIDE-RANGE MULTICOLOR IR DETECTOR

GOVERNMENT INTEREST

The invention described herein may be manufactured, used, and licensed by or for the Government for governmental purposes without the payment to us of any royalty thereon.

BACKGROUND OF THE INVENTION

1. Field of the Invention

The present invention relates to the field of infrared (IR) photodetection. More particularly, the invention relates to semiconductor IR detectors tailored for multicolor operation.

2. Description of the Prior Art

Solid-state, IR photodetectors often include a semiconductor body that is grown to form a superlattice of some predetermined configuration. Such detectors are fabricated from a variety of techniques such as molecular beam epitaxy (MBE), metal organic vapor phase epitaxy (MOVPE) and derivatives of these two techniques, including combinations of both. Those concerned with the development of such photodetector devices have long recognized the need for improved procedures of tailoring their frequency-absorption characteristics to provide for multicolor operation.

One class of IR photodetectors has a molecular structure characterized by a series of relatively wide quantum wells separated by relatively wide potential barriers. The barriers are usually of sufficient width to prevent any significant coupling between the energy levels of adjacent wells. The location of the ground and excited subbands in these wells are primarily dependent on the width of the wells. In general, such subbands rise when the well width is made narrower and fall when the well width is made wider. Consequently, fabricators of multicolor IR photodetectors often tailor their frequency-absorption characteristics by controlling the size of the well widths. Although such devices have served the purpose, the degree of control that fabricators have in tailoring their absorption characteristics using this technique has proved to be quite limiting.

Kwong-Kit Choi, one of the coinventors of the present invention, describes a more flexible tailoring technique in his U.S. Pat. No. 5,013,918 (hereinafter referred to as the '918 patent), issued May 7, 1991. The '918 patent discloses a multicolor IR photodetector for use in a variety of applications such as fiber optics communication, IR remote control systems, and IR sensing technology. The semiconductor device of the '918 patent has an array of quantum-well pairs. Each quantum-well pair includes a thick well and a thin well separated by a thin barrier that permits strong coupling between the thick and thin wells. Within these wells, there is a ground electron state and a number of excited states with different energies. IR energy incident on the device gives rise to intersubband absorption which excites electrons from the ground state into one of the excited states. A measurable photosignal results when the photoexcited electrons tunnel out of these wells. The IR absorption characteristics of these detectors show multiple absorption peaks. The results achieved using this technique differ substantially from those achieved by simply controlling the well width.

The effects of placing a thin barrier layer in a relatively wide quantum well, as is the situation in the '918 patent, have been the subject of several other studies. The results of two of these studies are reported in the following publications: Peters et al., "New Method of Controlling the Gaps Between the Minibands of a Superlattice", *Applied Physics Letters* 55(11), Sep. 11, 1989, pp. 1006–1008; Trzeciakowski et al., "Tailoring the Intersubband Absorption in Quantum Wells", *Applied Physics Letters* 55(9), Aug. 28, 1989, pp. 891–893.

The Trzeciakowski et al. publication, which discusses in detail the use of intersubband transitions for the detection of IR, shows how the transition energy in an IR detector may be tailored by shifting the ground state in the detector quantum well while not appreciably moving its excited state. In this regard, ground-state shifting was achieved by growing a thin layer of $Al_x Ga_{1-x}As$ in the middle of a GaAs well thereby creating a potential barrier for the electrons and for the holes. According to this publication, the thin barrier pushes the ground subband up while not appreciably effecting the excited subband because the wave function of the latter vanishes in the middle of the well while it is a maximum for the former.

Peters et al. also discuss the thin-barrier technique and shows how the barrier width and height, and the position of the barrier in the quantum well effect the positions of the ground and excited subbands. Peters et al. studied structures in which the well was also made of GaAs and the barrier was made out of the alloy $Al_x Ga_{1-x}As$. This study also describes how the IR absorption frequency of a quantum well behaves when the thin barrier of a particular width and height is placed in the center of the well.

Although there has been a long recognized need for IR photodetectors that can be tailored to detect multiwavelength radiation over a very wide range, no practical device for doing so has yet been devised. The present invention fulfills this need.

SUMMARY OF THE INVENTION

The general purpose of this invention is to provide an IR photodetector tailored to detect multiple wavelengths over a wide range. To achieve this, the present invention contemplates a solid-state structure having a series of quantum wells with widely different frequency-absorption characteristics. More specifically, the present invention contemplates a solid-state, IR photodetector having a plurality of quantum-well sets. The frequency-absorption characteristic for one of the wells in each set is tailored by simply adjusting the well width. The frequency-absorption characteristics of the other well in each set is tailored by adjusting the well width and by placing a thin barrier within the well.

It is, therefore, an object of the present invention to provide an IR photodetector that can detect multiwavelength radiation.

Another object of the invention is the provision of an IR photodetector that can be tailored during fabrication to detect a wide range of multiwavelength radiation.

BRIEF DESCRIPTION OF THE DRAWINGS

The invention will be more fully appreciated from the following detailed description when the same is considered in connection with the accompanying drawings in which:

FIGS. 2-7 are schematic conduction band potential profiles illustrating the preferred embodiments.

DETAILED DESCRIPTION OF THE PREFERRED EMBODIMENTS

Figure 1:
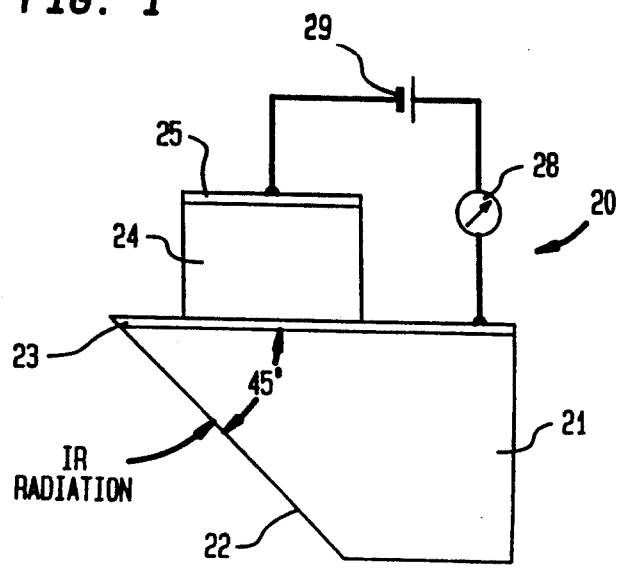
FIG. 1 is a schematic representation, greatly enlarged, of the structure of an IR radiation detector in accordance with the present invention.

Referring now to the drawings, there is shown in FIG. 1 an IR photodetector 20 having a substrate 21 that is transparent to IR radiation. Substrate 21 has a polished face 22 that functions as an input for IR radiation to be detected. Face 22, preferably oriented at forty-five degrees, is fabricated on substrate 21 that has a support surface on which a conductive contact layer 23 is deposited. Layer 23 is also transparent to IR radiation.

A semiconductor structure 24 is formed on layer 23. A second conductive contact layer 25 is deposited on the surface of structure 24. Layers 23, 25 are in contact with opposite parallel surfaces of structure 24. A voltage source 29 and a series-connected output meter 28 are connected across semiconductor structure 24 via contact layers 23, 25.

The operation of detector 20 is as follows: IR radiation that is incident on face 22 will pass through substrate 21 and contact layer 23. Semiconductor structure 24 absorbs that portion of the IR radiation having frequencies that fall within the absorption bands of structure 24. Voltage source 29 causes a current to flow through structure 24 and meter 28. The amount of current flow in this circuit depends on the total amount of IR radiation that is absorbed by structure 24. As such, meter 28, which measures current flow, provides a measure of the amount of radiation incident on detector 20 that lies within the absorption band of structure 24.

Figure 2:
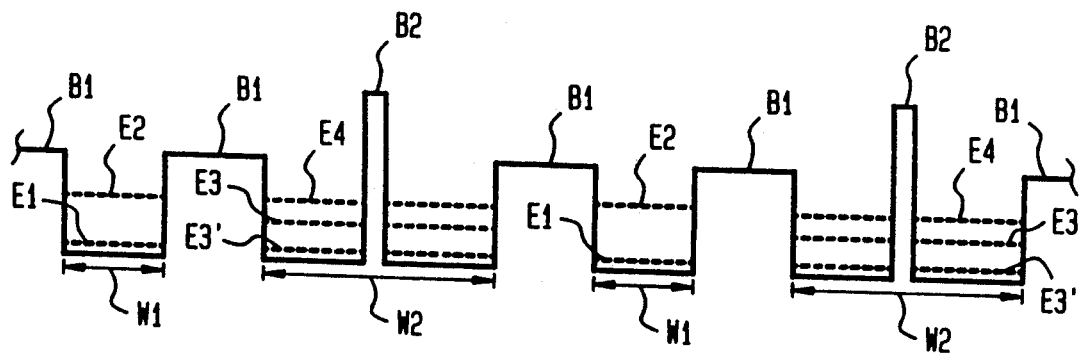

The absorption characteristics of structure 24 depends, among other things, on its quantum-well structure. FIG. 2 illustrates the conduction band potential profile for a preferred well structure for a small portion of semiconductor structure 24 with no bias voltage applied from source 29.

The potential profile of FIG. 2 shows a series of potential-well sets with each set having two potential wells of widths W1 and W2. Potential barriers B1 separate the wells. Barriers B1 are each of such a width that there is no appreciable coupling of the energy levels in adjacent wells. The widths of barriers B1 may all be equal, as shown in FIG. 2, or may be different. Well widths W1, W2 are chosen such that there are a minimum of two confined electron energy levels in each well.

The narrow wells, having width W1, have a ground energy level E1 and at least one excited energy level E2. The wide wells, having width W2, each have a thin spike barrier B2 located at its center. Semiconductor structure 24 may be formed using the conventional MBE techniques referred to in the '918 patent and the Peters et al. and Trzeciakowski et al. publications cited above. Structure 24 may be formed from the alloy $Al_x Ga_{1-x} As$ and spike barriers B2 may be formed from AlAs barriers of only a few monolayers thick.

The widths of barriers B2, which may be equal to each other or different, are small enough to permit strong coupling between the energy levels on either side thereof. Because there is a strong coupling between the energy levels on either side of barriers B2, the energy level configuration will be the same throughout each of the wide wells. As indicated above, the effect of placing thin barrier B2 in the center of the well is to move the ground energy level higher in the well. This is shown in FIG. 2 where energy level E3' represents the ground energy level for a well of width W2 without thin barrier B2, and energy level E3 represents the ground energy level for a similar well with barrier B2 present. Excited energy level E4 is located at substantially the same level with or without barrier B2. It is noted that the heights and widths of barriers B2 may be equal to each other, as shown, or may be different to produce different energy level spacings.

Figure 3:
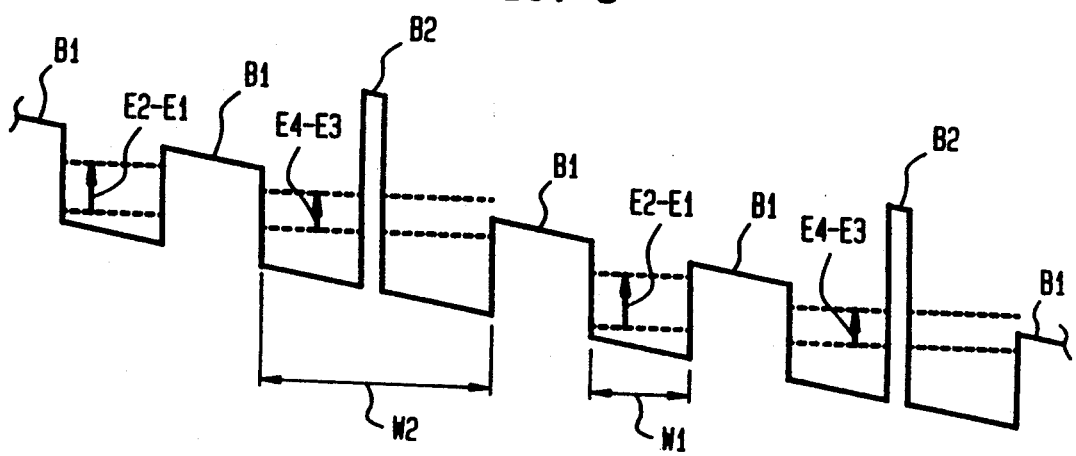

IR radiation of frequencies given by energy differences E2−E1 and E4−E3 are absorbed by structure 24. This absorption is manifested in the transition of electrons at energies E1 and E3 into electrons at energies E2 and E4, respectively. This intersubband transition produces significant electron populations in excited levels E2, E4, the magnitude of which will be a function of the amount of absorbed IR. When structure 24 is subjected to a bias from voltage source 29 as illustrated in FIG. 3, the excited electrons will produce a current flow through meter 28. The current flow measured by meter 28 will indicate the total IR illuminating photodetector 20 at the frequencies represented by energy differences E2−E1 and E4−E3.

Various modifications of the potential profile of FIGS. 2, 3 are contemplated and will be obvious to those skilled in the art in the light of the above teachings. Various semiconductor structures 24 may be fabricated having a variety of different well widths W1, W2. These structures 24 will usually produce significantly different frequency-absorption characteristics, many of which will provide multicolor operation over a wide range. However, it is noted that in some cases where W1 and W2 are widely different and E1, E2, E3 and E4 are widely different, the energy differences E2−E1 and E4−E3 may not be significantly different. As such, even though energy levels E1, E2, E3, E4 are all located at significantly different levels, IR may be absorbed at only one frequency or two closely spaced frequencies. One way to insure significant multicolor operation is to make the widths of the potential wells equal. This situation is illustrated in FIGS. 4, 5.

Figure 4:
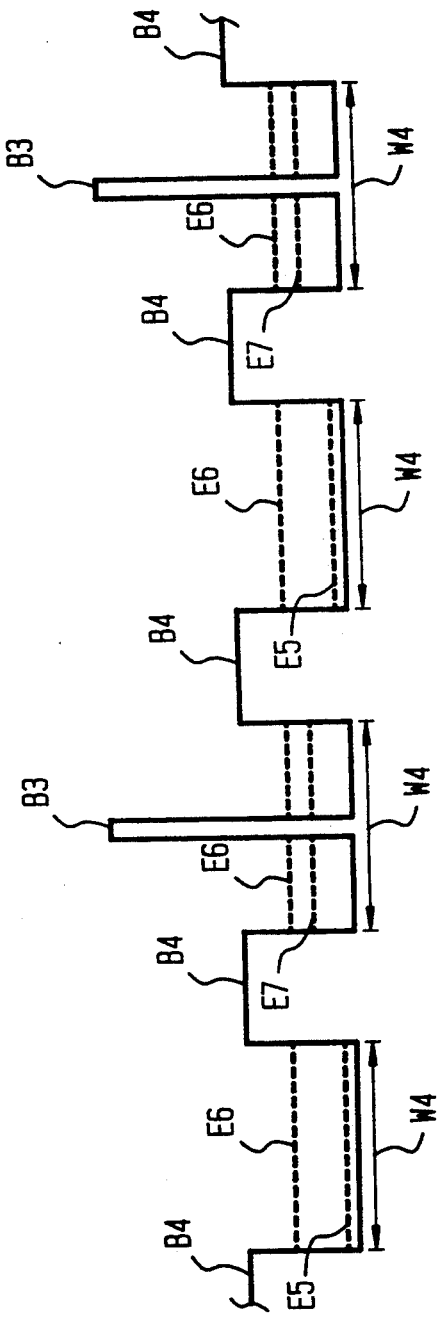
Figure 5:
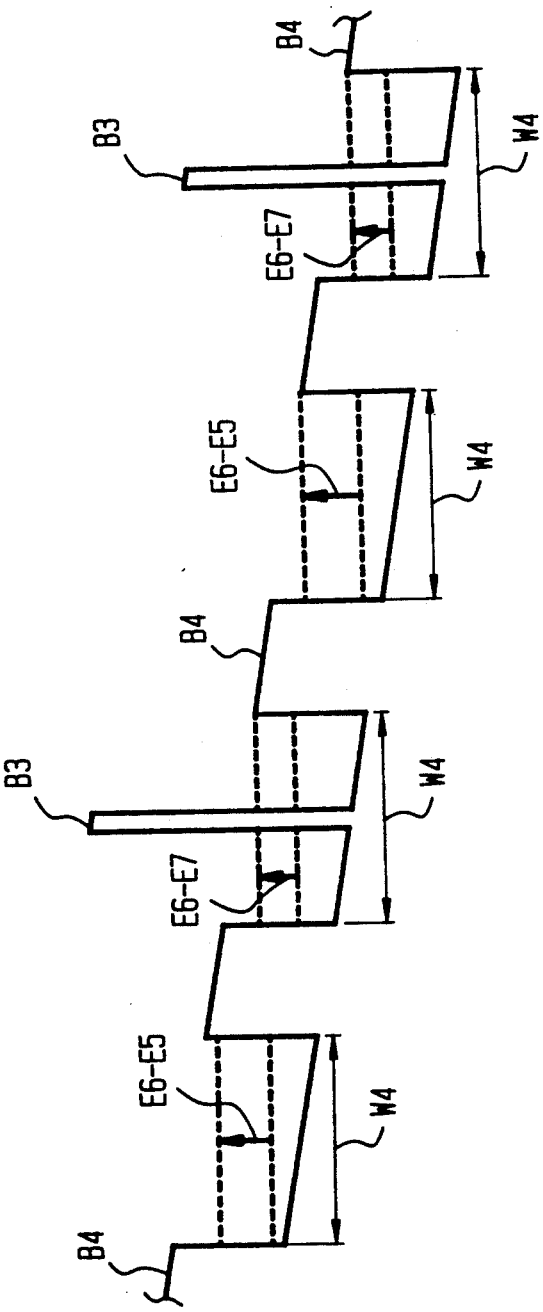

The potential profile shown in FIGS. 4–5 depicts the situation where the potential wells all have the same widths W4. FIG. 4 depicts the potential profile with zero bias and FIG. 5 depicts the situation with a forward bias. The potential wells are separated by wide barriers B4. Alternate potential wells have a narrow spike barrier B3 located at their centers. The potential wells not having the barrier B3 have ground energy levels E5 and upper energy levels E6. The potential wells having the spike barriers B3 have ground energy levels E7 and upper energy levels E6.

Because the potential wells all have the same width W4, their energy-level configurations would all be the same if spike barriers B3 were not present. However, due to the presence of spike barriers B3, ground energy levels E7 will be located at a significantly higher level than energy level E5. Upper energy level E6 in the wells with spike barrier B3 will be substantially unaffected by the presence of spike barrier B3. As such upper levels E6 in the FIG. 4 configuration will all be located at substantially the same level. Consequently, energy difference E6−E5 will be substantially greater than energy difference E6−E7. These energy differences will absorb IR at widely different frequencies giving rise to multicolor operation. It will be evident to those skilled in these arts that more complex techniques employing computer models may be used to find appropriate structures that will ensure significant multicolor operation.

FIG. 6 illustrates a potential profile to be used in a three-color IR detector. The FIG. 6 potential profile is made up of a series of similar potential-well sets 30. Each set 30 includes three potential wells having different energy-level spacings to produce a three-color IR photodetector.

Each set 30 includes: (1) a potential well of width W5 having energy levels E8 and E9; (2) a potential well of width W5 having a spike barrier B6 located at its center and having energy levels E9 and E10; and (3) a potential well of width W6 having a spike barrier B7 at its center and having energy levels E11 and E12. Spike barriers B6 and B7 may be formed, for example, as AlAs barriers a few monolayers thick. Energy levels E8, E9, E10, E11 and E12 are chosen such that energy differences E9−E8, E9−E10 and E11−E12 are significantly different, thereby producing three-color operation.

Similar modifications may be made to produce multicolor IR detectors having four or more different frequency absorption bands. FIG. 7 illustrates a potential profile for a four-color IR detector. In FIG. 7, the potential profile is made up of a series of alternate potential-well sets 31, 32. Each set 31, 32 has a profile similar to the potential profile shown in FIGS. 4, 5. Specifically, each potential-well set 31 is formed from two potential wells of equal width W7 separated by wide barriers B8. One of these wells has a spike barrier B9 located at its center. As such, each well in set 31 has substantially the same upper energy level E14 and widely differing ground energy levels E13 and E15. As such, energy differences E14−E13 and E14−E15 will be widely different, thereby producing IR absorption at two widely different IR frequencies.

Similarly, each potential-well set 32 is formed from two potential wells of equal width W8 separated by wide barriers B8. One of the potential wells in each set 32 has a spike barrier B10 located at its center. As such, each well in set 32 has substantially the same upper energy level E16 and widely differing ground energy levels E17 and E18. The four energy differences E14−E13, E14−E15, E16−E17 and E16−E18 are different, thereby producing four widely different IR absorption frequency bands to be used for four-color IR detection.

It should be understood, of course, that the foregoing disclosure relates to only preferred embodiments of the invention and that numerous other modifications or alterations may be made therein without departing from the spirit and the scope of the invention as set forth in the appended claims.

What is claimed is:

1. A solid-state, IR detector formed from a semiconductor comprising:
 a plurality of quantum-well sets, each said set having at least two quantum wells with at least two confined energy levels in each said well;
 a plurality of relatively wide potential barriers, each located between adjacent ones of said potential wells; and
 a plurality of spike potential barrier, each located at the center of one of said quantum wells in each of said set, each said spike potential barrier being thin enough to permit strong coupling between the energy levels on either side thereof such that the energy levels are common on either side thereof, and wherein the energy-level spacing between said confined energy levels of each of said wells in said quantum-well sets is different.

2. The detector of claim 1 wherein the widths of said quantum wells in each of said sets are different.

3. The detector of claim 1 wherein the widths of said quantum wells in each of said sets are substantially equal.

4. The detector of claim 1 wherein the cell widths are different for said cells in alternate ones of said sets.

5. The detector of claim 4 wherein the cell width in each of said sets is equal.

6. The detector of claim 1 wherein each said set has a plurality of quantum wells with one of said spike potential barriers located therein.

7. The detector of claim 1 further including a biasing circuit connected across said semiconductor.

8. The detector of claim 7 further including current sensing means for measuring the current flow in said semiconductor to indicate the total IR radiation absorbed by said semiconductor.

* * * * *